United States Patent
Salisbury et al.

(10) Patent No.: US 10,796,040 B2
(45) Date of Patent: Oct. 6, 2020

(54) INTEGRATED CIRCUIT DESIGN AND FABRICATION

(71) Applicant: Arm Limited, Cambridge (GB)

(72) Inventors: Sean James Salisbury, Appley Bridge (GB); Zheng Xu, Austin, TX (US); Arthur Brian Laughton, Hathersage (GB); Charles Filip Brej, Cambridge (GB)

(73) Assignee: ARM LIMITED, Cambridge (GB)

( * ) Notice: Subject to any disclaimer, the term of this patent is extended or adjusted under 35 U.S.C. 154(b) by 0 days.

(21) Appl. No.: 16/267,498

(22) Filed: Feb. 5, 2019

(65) Prior Publication Data

US 2020/0250281 A1 Aug. 6, 2020

(51) Int. Cl.
*G06F 30/30* (2020.01)
*G06F 30/394* (2020.01)
*G06F 30/398* (2020.01)
*G06F 9/30* (2018.01)

(52) U.S. Cl.
CPC .......... *G06F 30/30* (2020.01); *G06F 9/30003* (2013.01); *G06F 30/394* (2020.01); *G06F 30/398* (2020.01)

(58) Field of Classification Search
CPC ...... G06F 30/30; G06F 30/398; G06F 30/394; G06F 9/30003
See application file for complete search history.

(56) References Cited

U.S. PATENT DOCUMENTS

| | | | | |
|---|---|---|---|---|
| 2004/0114609 A1* | 6/2004 | Swarbrick | ............. | H04L 45/742 370/400 |
| 2004/0254906 A1* | 12/2004 | Shei | ...................... | G06F 30/331 703/23 |
| 2007/0118677 A1* | 5/2007 | Swartzentruber | ..... | H04L 49/101 710/316 |
| 2009/0007027 A1* | 1/2009 | Hutchings | ............... | G06F 30/34 716/132 |
| 2011/0185241 A1* | 7/2011 | Erickson | ................. | G06F 30/34 714/724 |
| 2015/0154332 A1* | 6/2015 | Hutchings | ............... | G06F 30/34 716/106 |
| 2018/0300440 A1* | 10/2018 | Ali | .......................... | G06F 40/14 |

(Continued)

*Primary Examiner* — Stacy Whitmore
(74) *Attorney, Agent, or Firm* — Nixon & Vanderhye PC

(57) ABSTRACT

A method comprises generating, using a computer, an integrated circuit layout including a plurality of data handling nodes interconnected by routing circuitry defining data packet routes between the plurality of data handling nodes; for a transaction source node configured to generate data packets associated with a data handling translation between that transaction source node and a transaction target node and having one or more routing data fields controlling routing of the data packet, detecting, using the computer, a difference between a first routing controlled by the one or more routing data fields and a selected second routing provided by the integrated circuit layout; and providing, using the computer, one or more data mapping nodes in the integrated circuit layout to map an initial value of one or more of the routing data fields of a data packet generated by the transaction source node to a mapped data value, so that the mapped data value controls routing of the data packet using the selected second routing.

15 Claims, 6 Drawing Sheets

(56) References Cited

U.S. PATENT DOCUMENTS

2019/0034576 A1\* 1/2019 Nalluri ................ G06F 30/398
2019/0087157 A1\* 3/2019 Gangwar ............... G06F 7/509
2019/0266307 A1\* 8/2019 Rao ..................... G06F 30/392
2019/0363829 A1\* 11/2019 Tune .................... H04L 45/22

\* cited by examiner

INTEGRATED CIRCUIT DESIGN AND FABRICATION

BACKGROUND

This disclosure relates to integrated circuit design and fabrication.

In the design of some integrated circuit topologies or layouts such as (for example) layouts for so-called network on chip (NoC) devices, multiple data handling nodes are connected together to form data communication paths.

SUMMARY

In an example arrangement there is provided a method comprising:

generating, using a computer, an integrated circuit layout including a plurality of data handling nodes interconnected by routing circuitry defining data packet routes between the plurality of data handling nodes;

for a transaction source node configured to generate data packets associated with a data handling translation between that transaction source node and a transaction target node and having one or more routing data fields controlling routing of the data packet, detecting, using the computer, a difference between a first routing controlled by the one or more routing data fields and a selected second routing provided by the integrated circuit layout; and providing, using the computer, one or more data mapping nodes in the integrated circuit layout to map an initial value of one or more of the routing data fields of a data packet generated by the transaction source node to a mapped data value, so that the mapped data value controls routing of the data packet using the selected second routing.

In another example arrangement there is provided an integrated circuit fabricated by the method defined above.

In another example arrangement there is provided a machine-readable, non-transitory storage medium which stores computer software which, when executed by a computer, causes the computer to perform a method comprising:

generating, using a computer, an integrated circuit layout including a plurality of data handling nodes interconnected by routing circuitry defining data packet routes between the plurality of data handling nodes;

for a transaction source node configured to generate data packets associated with a data handling translation between that transaction source node and a transaction target node and having one or more routing data fields controlling routing of the data packet, detecting, using the computer, a difference between a first routing controlled by the one or more routing data fields and a selected second routing provided by the integrated circuit layout; and providing, using the computer, one or more data mapping nodes in the integrated circuit layout to map an initial value of one or more of the routing data fields of a data packet generated by the transaction source node to a mapped data value, so that the mapped data value controls routing of the data packet using the selected second routing.

In another example arrangement there is provided an integrated circuit comprising:

a plurality of data handling nodes interconnected by routing circuitry defining data packet routes between the plurality of data handling nodes, the plurality of data handling nodes comprising at least a transaction source node and a transaction target node;

the transaction source node being configured to generate data packets associated with a data handling translation between the transaction source node and the transaction target node and having one or more routing data fields controlling a first routing of the data packet; and one or more data mapping nodes to map an initial value of one or more of the routing data fields of a data packet generated by the transaction source node to a mapped data value, so that the mapped data value controls routing of the data packet using a second routing different to the first routing.

In another example arrangement there is provided circuitry comprising:

a mapping data store, to store mapping data for one or more data fields controlling routing of a data packet associated with a data handling translation between a transaction source node and a transaction target node, the mapping data defining one or more mappings between initial and mapped data values of a respective data field;

detector circuitry to detect, for an input data packet, whether one or more data fields of the input data packet have associated mapping data in the mapping data store; and mapping circuitry, responsive to a detection that one or more data fields of the input data packet have associated mapping data in the mapping data store, to map an initial value of the one or more data fields to a respective mapped value using the mapping data.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Embodiments of the present disclosure relate to the design and optionally the fabrication of integrated circuit devices such as so-called networks on chip (NoC).

Figure 1:
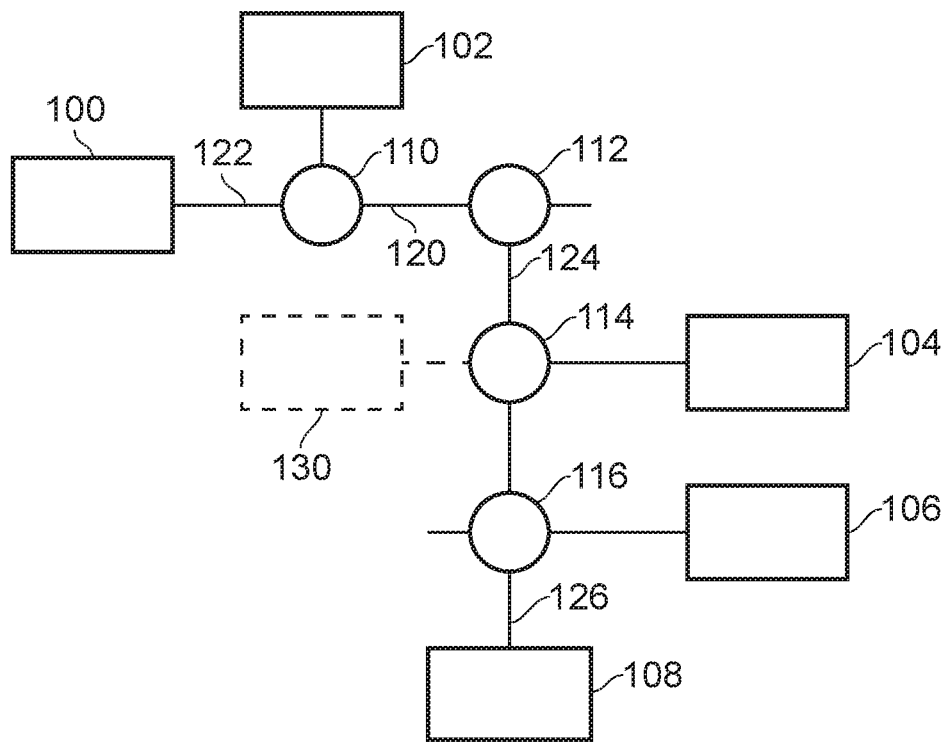
FIG. 1 schematically illustrates an example integrated circuit layout.

An NoC represents a system of interconnected processing devices or other devices, typically embodied on a single integrated circuit. An example of an NoC is shown schematically in FIG. 1 and shows a plurality of data handling notes 100, 102, 104, 106, 108 interconnected by routing circuitry having (in this example) an array of routers 110, 112, 114, 116. The routing circuitry defines data packet routes between the plurality of data-handling nodes.

Here, the data handling nodes may be so-called IP blocks connected to one another to provide a network of such blocks. In this example, an "IP block" is a unit of circuitry with particular functionality, which typically (though not necessarily) represents the intellectual property or IP of a single party. Commonly, in integrated circuit design, these so-called IP blocks are treated as units within the integrated circuit design process, even though an IP block may comprise very many gates, transistors or other components in its own right. The term "IP block" is used here in a generic illustrative sense; the IP blocks are simply functional blocks with the capability of communicating data with other such functional blocks. Their precise function is a matter of system design and is not relevant to the communication arrangements which will be discussed in more detail below. Similarly, although the term "IP block" implies ownership of rights in the module design, the present disclosure is not limited to any particular ownership arrangement.

In operation, a data handling node (such as the data handling node 100) acts as a transaction source node to generate data packets associated with a data handling transaction between that transaction source node and another node referred to as a transaction target node (for example the data handling node 108). In order to communicate such a data packet from the transaction source node to the transaction target node, the data packet has one or more routing data fields indicating to the routers in a data path between the transaction source node and the transaction target node how the packets should be routed.

The data packets may represent or carry as a payload, for example, so-called flits (flow control units or flow control digits).

Figure 2:
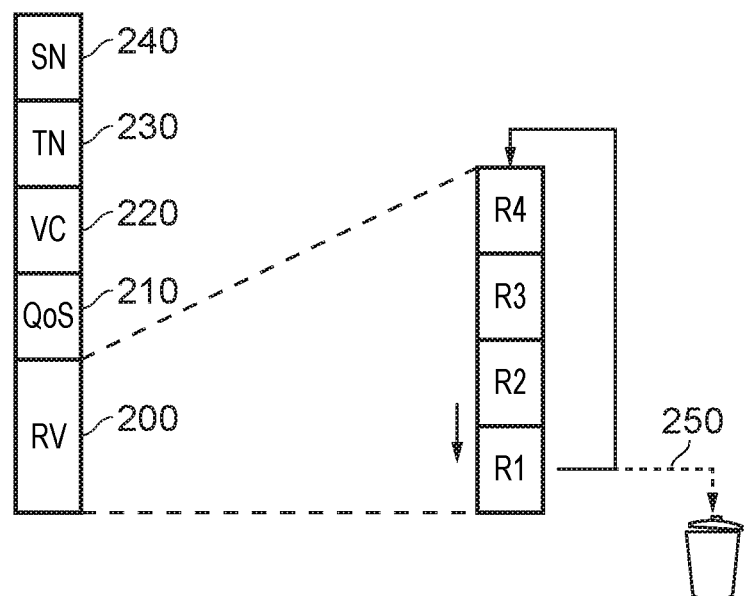
FIG. 2 schematically illustrates routing data fields.

FIG. 2 provides a schematic representation of an example of such routing data fields. In an example arrangement, these fields comprise:

a routing vector (RV) 200;
a quality of service (QoS) indicator 210 as an example of a service quality indicator defining an aspect of the handling of the data packet by the routing circuitry;
a virtual channel (VC) identifier 220 identifying a virtual channel for transmission of the data packet;
a transaction target node (TTN) identifier 230; and
a transaction source node (TSN) identifier 240.

Note that not all of these data fields need be provided. In example embodiments any one or more of these data fields is provided. Purely for the purposes of the present description, however, it will be assumed that in the example embodiment under discussion, all five of these example data fields are provided.

FIG. 2 also shows an example of the content of the routing vector 200, in that it provides a series of routing values R1 . . . R4. Each routing value indicates a routing decision taken at a corresponding one of the succession of routers in a data path between the transaction source node and the transaction target node. So, for example, comparing FIG. 2 to FIG. 1, and assuming that the transaction source node is the data handling node 100 and the transaction target node is the data handling node 108, a routing value R1 indicates which port of the router 110 to be taken by the packet, namely a port 120.

The routing value R1 may, for example, be defined by a number of least significant bits (LSBs) of the routing vector 200, with the number of bits assigned to the routing value R1 depending upon the number required to specify an output port at the first router 110.

The routing value R1 could, for example, specify that "counting ports in a clockwise direction from the input port 122, take the second port". In other examples, each port could be assigned a successive or arbitrary identification number and the routing value R1 could simply specify the identification number of the port 120 of the router 110.

Once the data packet has been passed by the router 110, the routing value R1 is no longer applicable to the further routing of that data packet. In some examples, the routing value R1 could then be discarded as shown schematically by a broken line 250. In other examples, however, the routing vector is rotated so that the bits corresponding to the routing value R1 are moved to the most significant bit (MSB) position in the routing vector 200 and the remaining bits of the routing vector 200 shuffled down towards the LSB positions so that a next routing value R2 occupies the least significant bit positions in the routing vector 200.

Once again, at the next router 112, the routing value R2 is used to specify an output port 124 and essential fault to the most significant bit positions of the routing vector 200, and so on. Finally, the routing value R4 specifies an output port 126 of the router 116 so that the data packet arrives at the transaction target node 108.

The data required to generate the routing vector may be provided as configuration data at the TSN 100.

Data handling transactions in the present context can include matters such as:

the transaction source node (TSN) reading a data item from the transaction target node (TTN), in which case the TTN will respond with a transaction response at least including the requested data item (or a fault indicator if the requested data item is not available);
the TSN writing a data item to the TTN, in which case the TTN may respond with a transaction completion acknowledgement; or
the TSN instructing a data-handling operation (such as the invalidation of a cached version of a data item) to be performed by the TTN, in which case the TTN may again respond with a transaction completion acknowledgement.

It will be appreciated that in at least some types of data-handling transaction, there is a need for some sort of response to be communicated back from the TTN to the TSN. This routing will also require one or more routing data fields similar to those shown in FIG. 2. In generating the routing data fields for a data packet returning a response from the TTN to the TSN, the TSN field 240 and the TTN field 230 can simply be interchanged so that, for the purposes of the response data packet, the original TTN is considered as the source of the response data packet and the original TSN is considered as the destination of the response data packet. However, depending on how the routing vector 200 is encoded, it may not in fact be possible simply to apply some sort of logical inversion to the "outbound" routing vector in order to derive the return route. Instead, the data required to build the return path routing vector may be provided as configuration data at the data handling node 108.

The VC field 220 and the QoS field 210 can be used in connection with the operation and in particular the arbitration carried out at the routers 110 . . . 116. For example, data packets can be carried according to multiple different virtual channels (effectively, a VC identifier associated with each packet defines which virtual channel applies. Virtual channels assign a respective time slot (in a time division multiplexed arrangement) or (in other examples) an identifier to packets being transmitted via a physical connection between two data handling nodes, so as to allow multiple communication paths (such as paths in each direction) to use that physical connection in such a way that packets associated with different VCs do not collide or otherwise interfere with one another.

Similarly, routing priority can be varied according to the specification of a required quality of service by the QoS field 210.

Accordingly, all of the one or more routing data fields contribute towards controlling the routing of a data packet between a transaction source node and a transaction target node.

The data required to generate the routing data fields is generally provided as a configuration of the relevant data handling node (at the TSN for a forward packet from the TSN to the TTN, or at the TTN for a return packet from the TTN to the TSN). In the context of integrated circuit fabrication, such information may be "hard wired" into the layout and design of the data-handling nodes acting as the TSN and TTN, as part of the overall design process during which the layout of the routing circuitry is created.

This, however, can lead to potential difficulties if there is a desire or requirement to re-use a data handling node layout in a different overall circuit configuration and/or at a different location (with respect to the routing circuitry) within the original circuit configuration.

For example, if there is a desire or requirement to re-use the functionality of the data handling node 100 at a circuit position relative to the routing circuitry shown by a broken line box 130, then this would require reconfiguring at least that part of the data handling node 100 so as to generate routing data fields applicable to the revised circuit location 130. Similarly, if there is a desire or requirement to make any other variation of the circuitry of FIG. 1, for example to produce a lower-performance or indeed a higher-performance version of that circuitry such that data-handling nodes are repositioned, omitted or supplemented with respect to the routing circuitry, then once again the functionality of the data handling nodes to generate routing data fields has to be recreated to match the revised layout and number of data-handling nodes.

Figure 3:
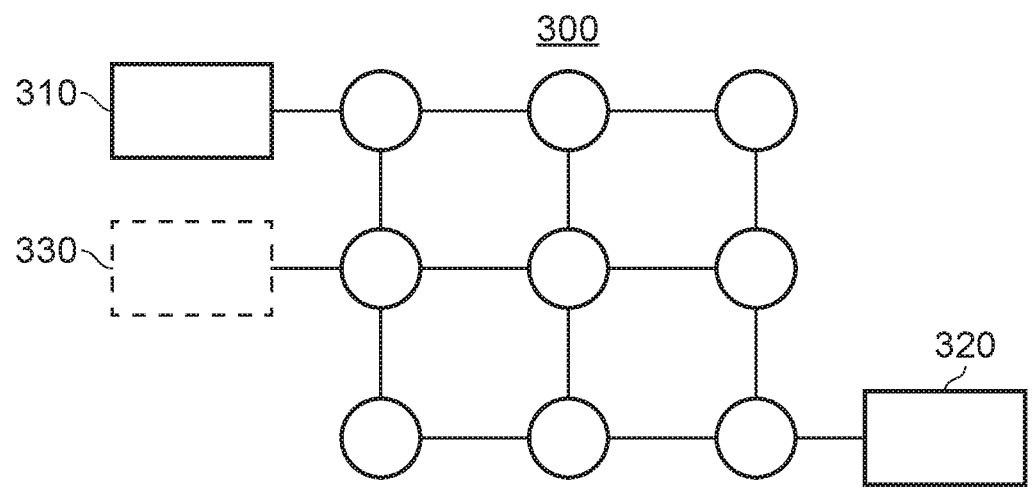
FIG. 3 schematically illustrates an example integrated circuits layout.

FIG. 3 schematically represents another example in which a so-called tiled or tessellated arrangement is used, involving an array 300 of routers providing the routing circuitry, defining a corresponding array of locations (for example, one or more per router) at which data-handling nodes 310, 320 (of which only two are shown for clarity of the diagram) may be connected.

In order for one of the data-handling nodes acting as a TSN (for example, the data handling node 310) to communicate data packets with another of the data-handling nodes acting as a TTN (for example, the data handling node 320) then each of these data-handling nodes needs to generate routing data fields representing a path through the array of routers to the other of the data-handling nodes. However, this arrangement has the potential disadvantage that a data handling node therefore has to be customised or bespoke with reference to its location within the array of locations defined by the routing circuitry 300. For example, under this arrangement, a data handling node designed to be located at the location shown by the node 310 could not then be re-used within an integrated circuit design at another location such as a location 330.

Figure 4:
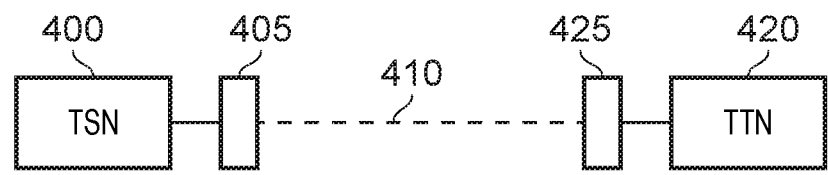
FIG. 4 schematically illustrates the use of data mapping nodes.

FIG. 4 provides an overview of an arrangement which can alleviate the potential issues discussed above involving re-purposing a data handling node in an integrated circuit layout, either in a different layout or at a different position within a similar layout.

The techniques to be described below allow for inserting into an integrated circuit layout a pre-designed module representing at least one of the data handling nodes. This is represented by the use of the data handling node location 130 in FIG. 1.

The techniques also allow for tessellating, using the computer, a plurality of instances of the pre-designed module within the integrated circuit layout to form an array of the data handling nodes. This corresponds to the example of FIG. 3 in which a common design of data handling node may be tessellated at different locations with respect to the array of routers provided by the routing circuitry 300.

FIG. 4 schematically illustrates a TSN 400 communicating via routing circuitry 410 (shown schematically as a broken line in FIG. 4) with a TTN 420.

Assuming that one or both of the TSN 400 and the TTN 420 are configured to generate routing data fields indicative of a particular (first) routing, a difference is detected between the first routing and a second routing provided by the integrated circuit layout in which the data-handling nodes are to be used, that is to say via the routing circuitry 410.

Then, as part of the integrated circuit layout and design process, one or more data mapping nodes 405, 425 are provided in the integrated circuit layout to map an initial value of one or more of the routing data fields of a data packet generated by the TSN 400 to a mapped data value, so that the maps data value controls routing of the data packet using the second routing.

Therefore, as an overview, a data handling node can be used as the TSN 400 and/or as the TTN 420 which is configured to generate routing data which is in fact incorrect for use with the current design of routing circuitry 410, even though it may have been correct in connection with another layout and/or another circuit configuration. The data mapping node 405 maps the incorrect routing data generated by the TSN 400 into correct routing data applicable to the routing of a data packet from the TSN 400 to the TTN 420. Similarly, for the return path, the data mapping node 425 maps the incorrect routing data generated by the TTN 420 into correct routing data applicable to the routing of a data packet from the TTN 420 to the TSN 400.

The mapping may apply to one of the routing data fields and/or to multiple ones of the routing data fields. Therefore, in some examples, one or more data mapping nodes in the integrated circuit layout are configured to map an initial value of one of the routing data fields of a data packet generated by the transaction source node to a mapped data value. In other examples, one or more data mapping nodes in the integrated circuit layout are configured to map an initial value of a combination of two or more of the routing data fields of a data packet generated by the transaction source node to a mapped combination data value.

Note that one or both of the data mapping nodes 405, 425 may be provided in a particular integrated circuit layout. In the case of the data mapping node 425, providing this node comprises detecting, using a computer handling the integrated circuit layout design, for a transaction response packet from the transaction target node to the transaction source node having one or more return routing data fields controlling routing of the transaction response data packet, a difference between a first return routing controlled by the one or more routing data fields and a selected second return routing provided by the integrated circuit layout; and providing, using the computer, one or more data mapping nodes in the integrated circuit layout to map an initial value of one of the return routing data fields of a transaction response packet generated by the transaction target node to a mapped data value.

Figure 5:
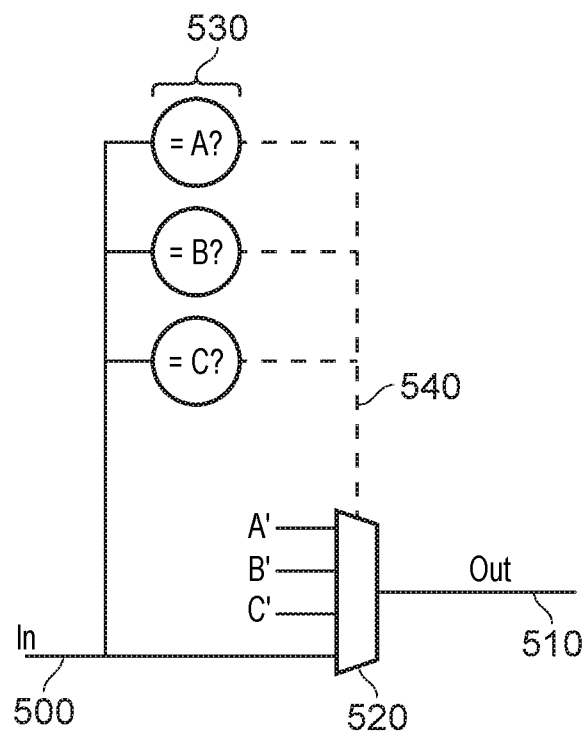
FIG. 5 schematically illustrates the operation of a data mapping node.

FIG. 5 provides a schematic example of a data mapping node, or at least a part of a data mapping node, which handles input data 500 and generates mapped output data 510. The input data 500 and the output data 510 may represent, for example, one of the fields discussed above (such as the routing vector) or a combination of more than one field (for example, the routing vector concatenated with the virtual channel indicator) or a combination of all of the fields present in the routing data associated with a packet.

The input data 500 is passed to a schematic multiplexer 520 along with (in this schematic example) three mapped values A', B', C'. Comparators 530 are provided so as to compare the input data with values to be mapped: A, B, C. If the input data is found to be equal to the value A then a control signal 540 is provided by the appropriate comparator in order to control the multiplexer 520 to pass the mapped value A'. Similarly, if the input data is found to be equal to the value B or C then a control signal 540 is provided by the appropriate comparator in order to control the multiplexer 520 to pass the mapped value B' or C' respectively. If the input data is found not to equal any of A, B and C then the multiplexer 520 passes the original value of the input data 500.

Figure 6:
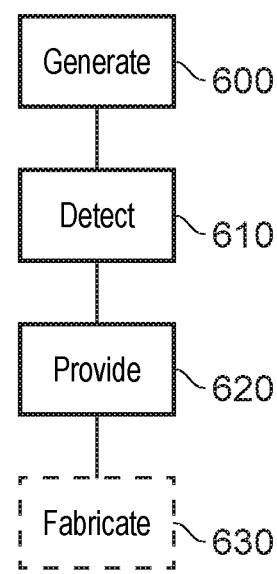
FIGS. 6 and 7 are schematic flowcharts illustrating respective methods.

The generation of the layout is handled by an integrated circuit layout generation method which also takes into account the processes discussed above. By way of summary, FIG. 6 provides a schematic flowchart representing such a method comprising:

generating (at a step 600), using a computer, an integrated circuit layout including a plurality of data handling nodes interconnected by routing circuitry defining data packet routes between the plurality of data handling nodes;

for a transaction source node configured to generate data packets associated with a data handling translation between that transaction source node and a transaction target node and having one or more routing data fields controlling routing of the data packet, detecting (at a step 610), using the computer, a difference between a first routing controlled by the one or more routing data fields and a selected second routing provided by the integrated circuit layout; and providing (at a step 620), using the computer, one or more data mapping nodes in the integrated circuit layout to map an initial value of one or more of the routing data fields of a data packet generated by the transaction source node to a mapped data value, so that the mapped data value controls routing of the data packet using the selected second routing.

Optionally, a further step 630 may involve fabricating an integrated circuit according to the generated layout, using any known fabrication technique.

Figure 7:
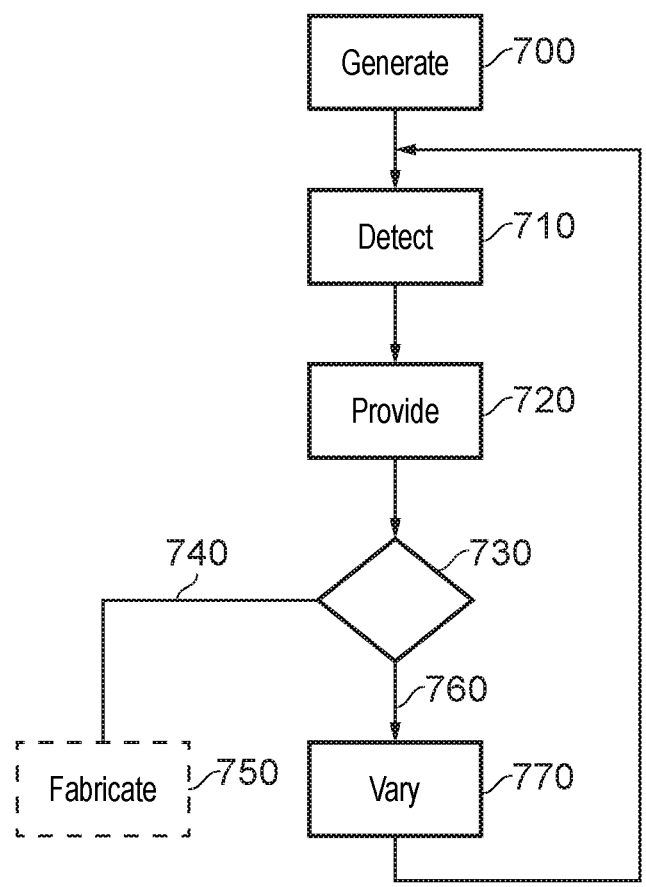

In some examples of the present technique, the process simply detects differences at the step 610 of FIG. 6 and provides one or more mapping nodes to address those differences. In other examples, the integrated circuit layout design process can include potential variations to the configuration and/or layout in order to affect (for example, to reduce) the amount of circuitry required to implement the one or more mapping nodes in the final design. FIG. 7 provides a schematic flowchart illustrating an example of such a technique.

Referring to FIG. 7, a generating step 700 corresponds generally to the generating step 600 of FIG. 6. An iterative process then follows, comprising a detecting step 710 which operates in a corresponding way to the detecting step 610 of FIG. 6 and a providing step 720, again operating in a corresponding way to the providing step 620 of FIG. 6. In contrast to FIG. 6, however, a decision block 730, to be discussed further below, then follows. An output path 740 of the decision block 730 represents a finalised layout and can lead to an optional step 750 of fabrication of the integrated circuit layout using any known fabrication technique.

However, another output path 760 of the decision block 730 leads to a varying step 770 in which the generated layout provided by the step 700 is varied so that a further iteration of the detecting 710 and the providing 720 steps can be performed. Examples of such variations will be discussed below.

Therefore, the decision block 730 represents a computer-implemented decision as to whether the integrated circuit layout at that stage in the iterative process should be considered as a final design. This decision can be based upon various parameters. For example, if the iterative process 710 . . . 770 has been carried out at least a threshold number of times then the design can be considered final. In another example, a so-called cost function can be associated with the provision of the data mapping nodes. The cost function can be a representation of one or more of a quantity of circuitry, an increase in latency, a change in integrated circuit layout area, a number of routing data field values to be mapped or the like, such that the iterative process is continued until an evaluation of the cost function at an instance of the step 730 generates less than a threshold cost.

The changes made by the varying step 770 can relate to the routing circuitry employed in the integrated circuit layout. The process of FIG. 7 can be continued (using the decision block 730 as discussed above) until a threshold cost function is reached or for a predetermined number of iterations, so that amongst two or more candidate configurations of the routing circuitry, generating, using the computer, an integrated circuit layout having a configuration of the routing circuitry for which the number of routing data field values to be mapped (or another expression of the cost function) is the lowest.

The generating step 700 and the zero or more iterations of the varying step 770 can together be considered as a composite generating step.

Figure 8A:
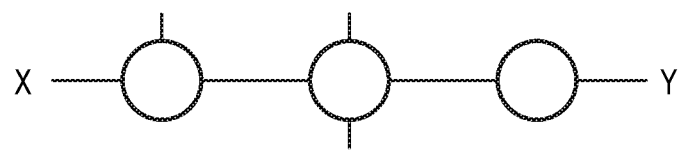
FIGS. 8a-8c schematically illustrate routing circuitry.
Figure 8B:
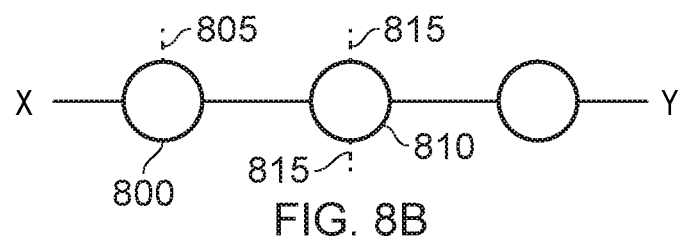
Figure 8C:
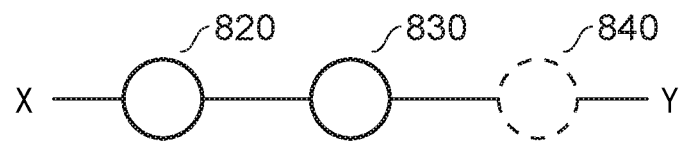

FIGS. 8a-8c represent at least portions of routing circuitry comprising an array of two or more interconnected routers. The routing circuitry of these Figures can be considered as providing routing between a point X and a point Y in the integrated circuit layout.

In an example, FIG. 8a schematically represents an original routing configuration, for which the data handling nodes in question were originally configured.

In an example generated layout according to the second routing, routers 800, 810 have different numbers of ports to corresponding routers in the circuitry of FIG. 8a. In this example, the varying step 770 can add one or more dummy router ports 805, 815 to the routers 800, 810 in order to reduce the number of routing data field values to be mapped in order to use the routing circuitry of FIG. 8b with data-handling nodes originally configured for the routing circuitry of FIG. 8a.

In another example of FIG. 8c, instead of the three routers provided in FIG. 8a, only to routers 820, 830 are provided. In this example, even though it is not necessary for routing purposes, a further router 840 can be included by the varying step 770 in order to reduce the number of routing data field values to be mapped so that the routing circuitry of FIG. 8c can be used with data-handling nodes originally configured for the routing circuitry of FIG. 8a.

The arrangement of FIGS. 8b and 8c provide examples in which the method discussed above comprises altering or varying, using the computer, one or more of a layout of array of routers and the respective configuration of one or more of the routers so as to reduce the number of routing data fields to be mapped.

Figure 9:
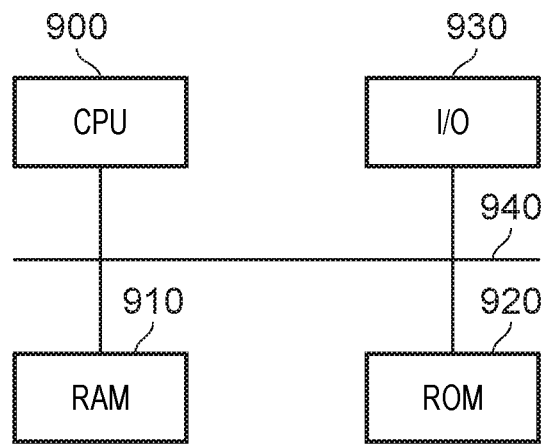
FIG. 9 schematically illustrates a data processing system.

The integrated circuit design techniques discussed above, and in particular all of the steps of FIG. 6 except for the fabrication step 630 or all of the steps of FIG. 7 except for the fabrication step 750, can be carried out by a computer or data processing apparatus such as that shown in FIG. 9. In FIG. 9, a processing element or CPU 900, a random access memory (RAM) 910, a read only memory (ROM) 920 and input/output (I/O) circuitry 930 are all interconnected by a bus structure 940. In use, the CPU 900 executes program code stored in, for example, the ROM 920 so as to cause the computer to carry out one of the design methods discussed above. In this way, the ROM 920 acts as an example of a machine-readable, non-transitory storage medium which stores computer software which, when executed by a computer, causes the computer to perform a method as described above. Other examples may be a magnetic or optical disk or a flash memory.

Figure 10:
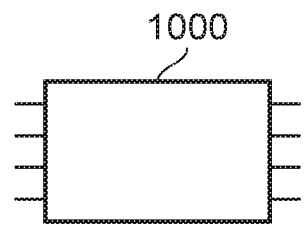
FIG. 10 schematically illustrates an integrated circuit.

Finally, FIG. 10 is a schematic representation of an integrated circuit 1000 fabricated by the methods of FIG. 6 or FIG. 7, including the respective fabrication step 630, 750.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function, in which case software or program instructions by which the function is performed, and a providing medium such as a non-transitory machine-readable medium by which such software or program instructions are provided (for example, stored) are considered to represent embodiments of the disclosure. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. A method comprising:
generating, using a computer, an integrated circuit layout including a plurality of data handling nodes interconnected by routing circuitry defining data packet routes between the plurality of data handling nodes;
for a transaction source node configured to generate data packets associated with a data handling translation between that transaction source node and a transaction target node and having one or more routing data fields controlling routing of the data packet, detecting, using the computer, a difference between a first routing controlled by the one or more routing data fields and a selected second routing provided by the integrated circuit layout; and
providing, using the computer, based on the detected difference, or more data mapping nodes in the integrated circuit layout to map an initial value of one or more of the routing data fields of a data packet generated by the transaction source node to a mapped data value, so that the mapped data value controls routing of the data packet using the selected second routing.

2. A method according to claim 1 in which the routing data fields include one or more selected from the list consisting of:
a transaction source node identifier;
a transaction target node identifier;
route vector data defining a data packet route via the routing circuitry;
a virtual channel identifier defining a virtual channel for transmission of the data packet; and
a service quality indicator defining an aspect of the handling of the data packet by the routing circuitry.

3. A method according to claim 2, in which the providing step comprises providing, using the computer, one or more data mapping nodes in the integrated circuit layout to map an initial value of one of the routing data fields of a data packet generated by the transaction source node to a mapped data value.

4. A method according to claim 2, in which the providing step comprises providing, using the computer, one or more data mapping nodes in the integrated circuit layout to map an initial value of a combination of two or more of the routing data fields of a data packet generated by the transaction source node to a mapped combination data value.

5. A method according to claim 1, comprising:
detecting, using the computer, for a transaction response packet from the transaction target node to the transaction source node having one or more return routing data fields controlling routing of the transaction response data packet, a difference between a first return routing controlled by the one or more routing data fields and a selected second return routing provided by the integrated circuit layout; and
providing, using the computer, one or more data mapping nodes in the integrated circuit layout to map an initial value of one of the return routing data fields of a transaction response packet generated by the transaction target node to a mapped data value.

6. A method according to claim 1, in which the generating step comprises inserting, using the computer, into the integrated circuit layout a pre-designed module representing at least one of the data handling nodes.

7. A method according to claim 6, in which the generating step comprises tessellating, using the computer, a plurality of instances of the pre-designed module within the integrated circuit layout to form an array of the data handling nodes.

8. A method according to claim 6, in which the generating step comprises:
amongst two or more candidate configurations of the routing circuitry, generating, using the computer, an integrated circuit layout having a configuration of the routing circuitry for which the number of routing data field values to be mapped is the lowest.

9. A method according to claim 8, in which:
the routing circuitry comprises an array of two or more interconnected routers; and
the method comprises altering, using the computer, one or more of a layout of array of routers and the respective configuration of one or more of the routers so as to reduce the number of routing data fields to be mapped.

10. A method according to claim 1, in which:
the routing circuitry comprises an array of two or more interconnected routers; and
the method comprises altering, using the computer, one or more of a layout of array of routers and the respective configuration of one or more of the routers so as to reduce the number of routing data fields to be mapped.

11. A method according to claim 1, comprising:
fabricating an integrated circuit according to the integrated circuit layout.

12. An integrated circuit fabricated by the method of claim 11.

13. A machine-readable, non-transitory storage medium which stores computer software which, when executed by a computer, causes the computer to perform a method comprising:
generating, using the computer, an integrated circuit layout including a plurality of data handling nodes interconnected by routing circuitry defining data packet routes between the plurality of data handling nodes;
for a transaction source node configured to generate data packets associated with a data handling translation between that transaction source node and a transaction target node and having one or more routing data fields controlling routing of the data packet, detecting, using the computer, a difference between a first routing controlled by the one or more routing data fields and a selected second routing provided by the integrated circuit layout; and
providing, using the computer, based on the detected difference, one or more data mapping nodes in the integrated circuit layout to map an initial value of one or more of the routing data fields of a data packet generated by the transaction source node to a mapped data value, so that the mapped data value controls routing of the data packet using the selected second routing.

14. An integrated circuit comprising:
a plurality of data handling nodes interconnected by routing circuitry defining data packet routes between the plurality of data handling nodes, the plurality of data handling nodes comprising at least a transaction source node and a transaction target node;
the transaction source node being configured to generate data packets associated with a data handling translation between the transaction source node and the transaction target node and having one or more routing data fields controlling a first routing of the data packet; and
one or more data mapping nodes to map an initial value of one or more of the routing data fields of a data packet generated by the transaction source node to a mapped data value, so that the mapped data value controls routing of the data packet using a second routing different from the first routing.

15. Circuitry comprising:
a mapping data store, to store mapping data for one or more data fields controlling routing of a data packet associated with a data handling translation between a transaction source node and a transaction target node, the mapping data defining one or more mappings between initial and mapped data values of a respective data field;
detector circuitry to detect, for an input data packet, whether one or more data fields of the input data packet have associated mapping data in the mapping data store; and
mapping circuitry, responsive to a detection that one or more data fields of the input data packet have associated mapping data in the mapping data store, to map an initial value of the one or more data fields to a respective mapped value using the mapping data.

* * * * *